(12) United States Patent
Okamura

(10) Patent No.: US 12,051,355 B1
(45) Date of Patent: Jul. 30, 2024

(54) DEVICE AND METHOD FOR PIXEL DATA COMPENSATION FOR DISPLAY DRIVERS WITH STAGGERED BUMP ARRANGEMENT

(71) Applicant: Synaptics Incorporated, San Jose, CA (US)

(72) Inventor: Kazuhiro Okamura, San Jose, CA (US)

(73) Assignee: Synaptics Incorporated, San Jose, CA (US)

( * ) Notice: Subject to any disclaimer, the term of this patent is extended or adjusted under 35 U.S.C. 154(b) by 0 days.

(21) Appl. No.: 18/342,105

(22) Filed: Jun. 27, 2023

(51) Int. Cl.
 G09G 3/30 (2006.01)
 G09G 3/20 (2006.01)
 G09G 3/3225 (2016.01)
 G09G 3/36 (2006.01)
 H01L 23/00 (2006.01)

(52) U.S. Cl.
 CPC ......... *G09G 3/2007* (2013.01); *G09G 3/3225* (2013.01); *H01L 24/14* (2013.01); *H01L 24/16* (2013.01); *G09G 2300/0819* (2013.01); *G09G 2310/08* (2013.01); *G09G 2320/0626* (2013.01); *H01L 2224/14133* (2013.01); *H01L 2224/14177* (2013.01); *H01L 2224/16225* (2013.01)

(58) Field of Classification Search
 CPC ............. G09G 5/2007; G09G 5/3225; G09G 2300/0819; G09G 2310/08; H01L 24/14; H01L 24/16; H01L 2224/14133; H01L 2224/16225
 See application file for complete search history.

(56) References Cited

U.S. PATENT DOCUMENTS

| | | | |
|---|---|---|---|
| 2010/0123245 A1* | 5/2010 | Lee | H01L 24/14 257/737 |
| 2017/0285376 A1* | 10/2017 | Okamae | H01L 25/18 |
| 2018/0005929 A1* | 1/2018 | Shin | H01L 23/49816 |
| 2018/0063956 A1* | 3/2018 | Min | H05K 1/028 |
| 2021/0383730 A1* | 12/2021 | Kim | G06F 1/1616 |
| 2022/0013048 A1* | 1/2022 | Kim | H10K 59/131 |

* cited by examiner

*Primary Examiner* — Sanghyuk Park
(74) *Attorney, Agent, or Firm* — Leydig, Voit & Mayer, Ltd.

(57) ABSTRACT

A display driver includes a bump array with a staggered bump arrangement, a data compensation circuit, and driver circuitry. The data compensation circuit processes input pixel data for a pixel of a display panel to generate compensated pixel data. The driver circuitry generates a data voltage based on the compensated pixel data and output the data voltage to the pixel via a bump of the bump array. The processing of the input pixel data is based on a location of the bump in the bump array.

20 Claims, 13 Drawing Sheets

FIG. 10B
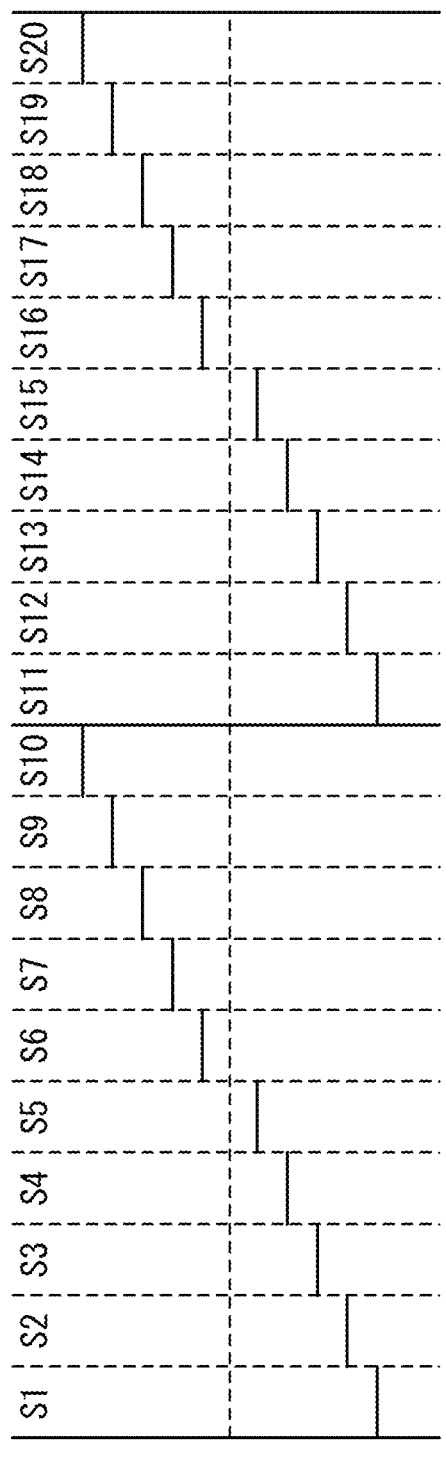
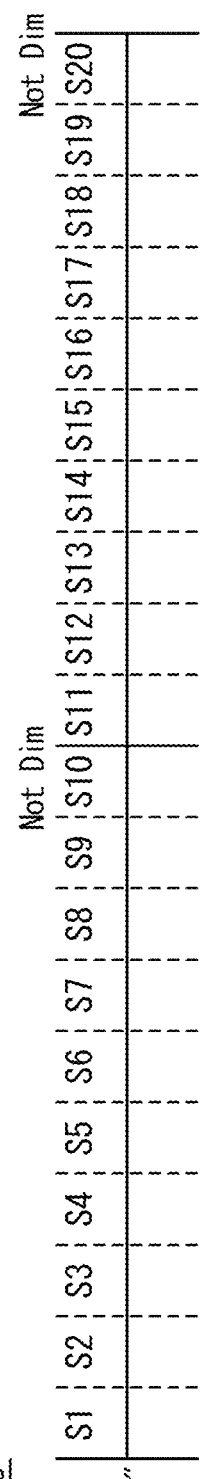

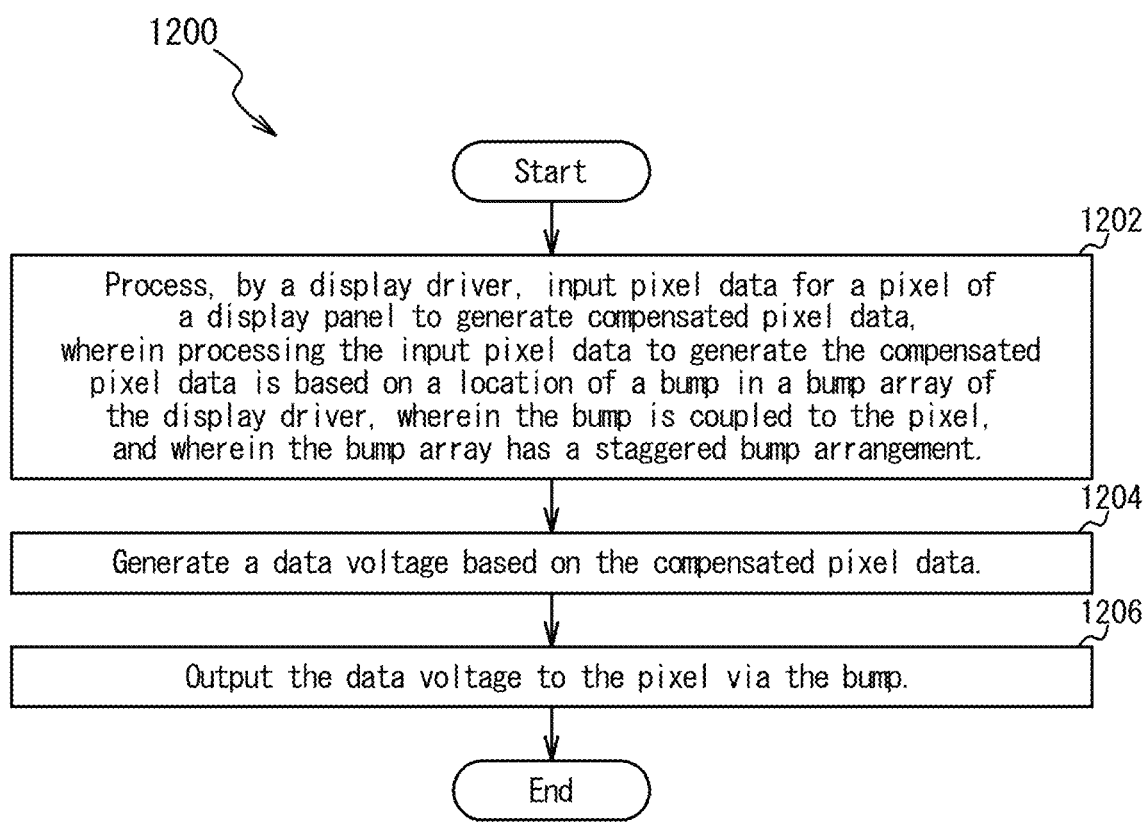

DEVICE AND METHOD FOR PIXEL DATA COMPENSATION FOR DISPLAY DRIVERS WITH STAGGERED BUMP ARRANGEMENT

FIELD

The disclosed technology generally relates to display devices, more particularly, pixel data compensation for display drivers with a staggered bump arrangement.

BACKGROUND

Display drivers configured to drive display panels may be bonded to the display panels using flip-chip bonding technology. A display driver adapted to flip-chip bonding may include an array of bumps, and the bumps may be bonded to bond pads formed on the substrate of the display panel to provide mechanical and electrical connections between the display driver and the display panel. The use of flip-chip bonding may effectively facilitate size reduction of the display module that includes the display driver and the display panel.

The bumps may be arranged in a "staggered" arrangement to facilitate the placement of routing traces coupled to the bond pads. In a staggered bump arrangement, the bumps may be arranged in a plurality of rows, with corresponding bumps of adjacent rows offset from each other. The bond pads may be arranged at positions determined in accordance with the staggered bump arrangement. The staggered bump arrangement allows an increasing number of routing traces to be placed in the bond pad array and also reduces the area required to arrange the bumps on the display driver.

SUMMARY

This summary is provided to introduce in a simplified form a selection of concepts that are further described below in the detailed description. This summary is not intended to identify key features or essential features of the claimed subject matter, nor is it intended to limit the scope of the claimed subject matter.

In general, in one aspect, one or more embodiments relate to a display driver which includes a bump array with a staggered bump arrangement, a data compensation circuit, and driver circuitry. The data compensation circuit is configured to process input pixel data for a pixel of a display panel to generate compensated pixel data. The driver circuitry is configured to generate a data voltage based on the compensated pixel data and output the data voltage to the pixel via a bump of the bump array. The processing of the input pixel data is based on a location of the bump in the bump array.

In general, in one aspect, one or more embodiments relate to a display device including a display panel and a display driver. The display driver includes a bump array with a staggered bump arrangement. The display driver is configured to process input pixel data for a pixel of the display panel to generate compensated pixel data. The display driver is further configured to output the data voltage to the pixel via a bump of the bump array. The processing of the input pixel data is based on a location of the bump in the bump array.

In general, in one aspect, one or more embodiments relate to a method for pixel data compensation. The method includes processing, by a display driver, input pixel data for a pixel of a display panel to generate compensated pixel data, wherein processing the input pixel data to generate the compensated pixel data is based on a location of a bump in a bump array of the display driver. The bump is coupled to the pixel. The method further includes generating a data voltage based on the compensated pixel data. The method further includes outputting the data voltage to the pixel via the bump.

Other aspects of the embodiments will be apparent from the following description and the appended claims.

BRIEF DESCRIPTION OF DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments, and are therefore not to be considered limiting of inventive scope, as the disclosure may admit to other equally effective embodiments.

FIG. 10B shows example pixel data compensation for a fixed grey level, according to one or more embodiments.

FIG. 12 shows a flowchart depicting an example method for pixel luminance compensation, according to one or more embodiments.

Figure 1:
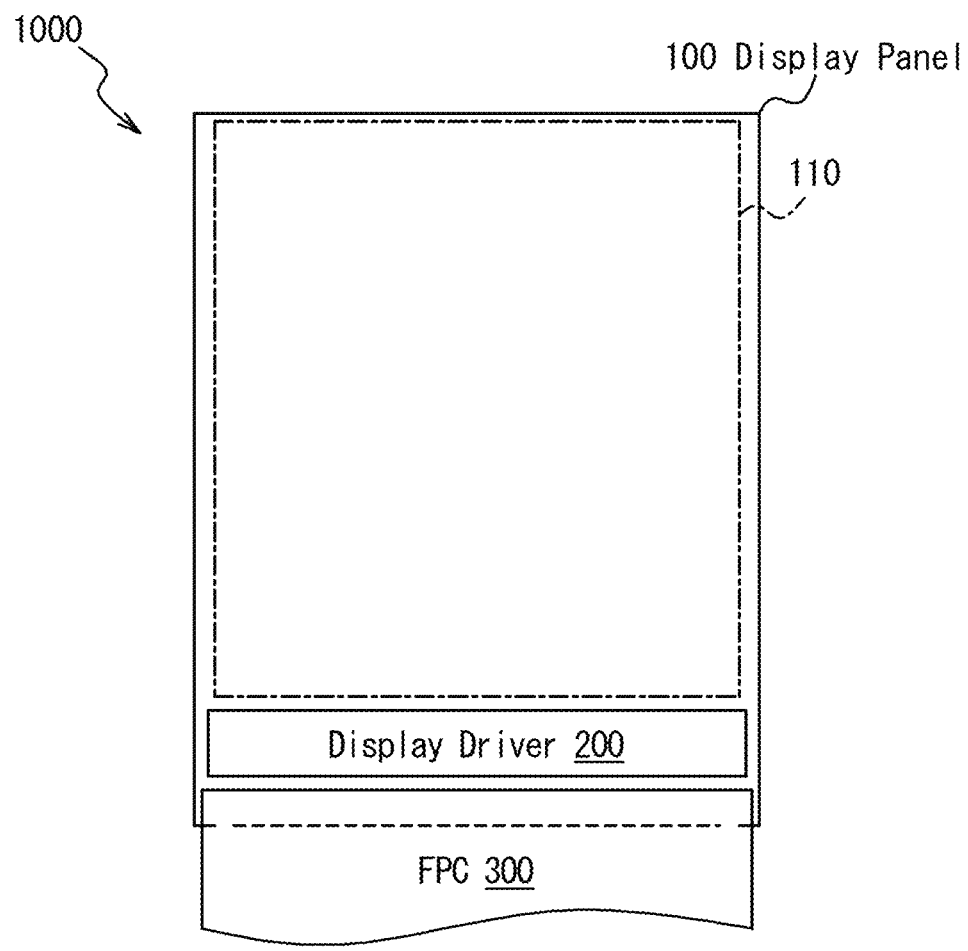
FIG. 1 shows an example configuration of a display module, according to one or more embodiments.

To facilitate understanding, identical reference numerals have been used, where possible, to designate identical elements that are common to the figures. It is contemplated that elements disclosed in one embodiment may be beneficially utilized in other embodiments without specific recitation. Suffixes may be attached to reference numerals for distinguishing identical elements from each other. The drawings referred to herein should not be understood as being drawn to scale unless specifically noted. Also, the drawings are often simplified and details or components omitted for clarity of presentation and explanation. The drawings and

DETAILED DESCRIPTION

The following detailed description is merely exemplary in nature, and is not intended to limit the disclosed technology or the application and uses of the disclosed technology. Furthermore, there is no intention to be bound by any expressed or implied theory presented in the preceding technical field, background, or the following detailed description.

In the following detailed description of embodiments, numerous specific details are set forth in order to provide a more thorough understanding of the disclosed technology. The term "coupled" as used herein means connected directly to or connected through one or more intervening components or circuits. The terms "electronic system" and "electronic device" may be used interchangeably to refer to any system capable of electronically processing information. However, it will be apparent to one of ordinary skill in the art that the disclosed technology may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

Display modules, such as liquid crystal display (LCD) modules and organic light emitting diode (OLED) display modules, may use flip-chip bonding to mount a display driver on a display panel. A display driver adapted to flip-chip bonding may include an array of bumps formed on the surface of the display driver. The bumps are bonded to bond pads formed on the substrate of the display panel to provide mechanical and electrical connections between the display driver and the display panel. The use of flip-chip bonding may effectively facilitate size reduction of display modules.

With the recent increase in display resolution, a display driver may be configured to provide an increased number of signals (e.g., data voltages used to update pixels) to the display panel. The increase in the number of signals provided to the display panel may be accompanied by an increase in the number of bumps and bond pads, which may make it difficult to place routing traces coupled to the bond pads on the display panel.

To facilitate the placement of the routing traces coupled to the bond pads, the bumps may be arranged in a "staggered" arrangement. In a staggered bump arrangement, the bumps may be arranged in a plurality of rows with corresponding bumps of adjacent rows offset from each other while the bond pads may be arranged at positions determined in accordance with the staggered bump arrangement. The staggered bump arrangement allows an increasing number of routing traces to be placed in the bond pad array, while also reducing the area required to arrange the bumps on the display driver.

Some display drivers may use a staggered bump arrangement for a bump array that outputs drive voltages to pixels being programmed or updated. However, the use of the staggered bump arrangement for the bump array that outputs the drive voltages may however increase variations in the lengths of routing traces coupled to the bond pads, potentially causing significant variations in the resistances and/or capacitances of the routing traces via which the drive voltages are provided to the pixels. The variations in the resistances and/or capacitances of the routing traces may cause image artifacts, such as uneven image brightness.

The present disclosure provides various technologies to mitigate image artifacts potentially caused by a staggered bump arrangement. In one or more embodiments, a display driver may include a bump array with a staggered bump arrangement. The display driver may be configured to process input pixel data for a target pixel of a display panel to generate compensated pixel data for the target pixel. The display driver may be further configured to generate a data voltage based on the compensated pixel data and output the data voltage to the target pixel via a bump of the bump array. In the generation of the compensated pixel data, the input pixel data may be processed based on the location of the bump used to output the data voltage. The pixel data compensation based on the location of the bump may effectively mitigate image artifacts potentially caused by the "staggered" bump arrangement. In the following, a detail description is given of various embodiments of the present disclosure.

FIG. 1 shows an example configuration of a display module 1000, according to one or more embodiments. In the shown embodiment, the display module 1000 includes a display panel 100, a display driver 200, and a flexible printed circuit board (FPC) 300. The display panel 100 includes an array of pixels (not shown in FIG. 1) arranged in an active area 110. In one embodiment, the display panel 100 is an OLED display panel. In an alternative embodiment, the display panel 100 may be a micro LED display panel, an LCD panel or a different type of display panel. The display driver 200 is configured to program or update the pixels of the display panel 100 based on image data generated by an image source (not shown) such as an application processor (AP), a central processing unit (CPU) or other processors configured to generate the image data. The FPC 300 includes routing traces or interconnections to provide the image data and other control data and/or control signals to the display driver 200. The FPC 300 may further include other components (e.g., one or more ICs, capacitors and/or other passive elements) for signal processing and/or transformation.

Figure 2:
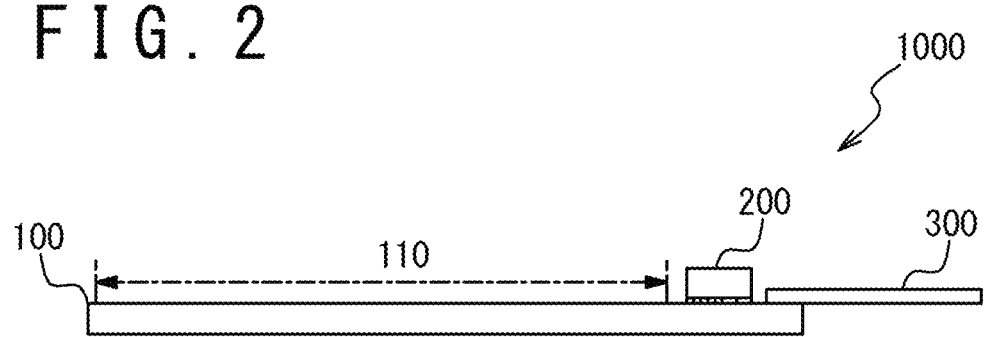
FIG. 2 shows an example side-view configuration of a display module, according to one or more embodiment.

FIG. 2 shows an example side-view configuration of the display module 1000, according to one or more embodiment. In one or more embodiments, the display driver 200 is mounted on the display panel 100 using flip-chip bonding technology. The FPC 300 is bonded to the display panel 100 to deliver signals to the display driver 200 via conductors formed on the display panel 100.

Figure 3:
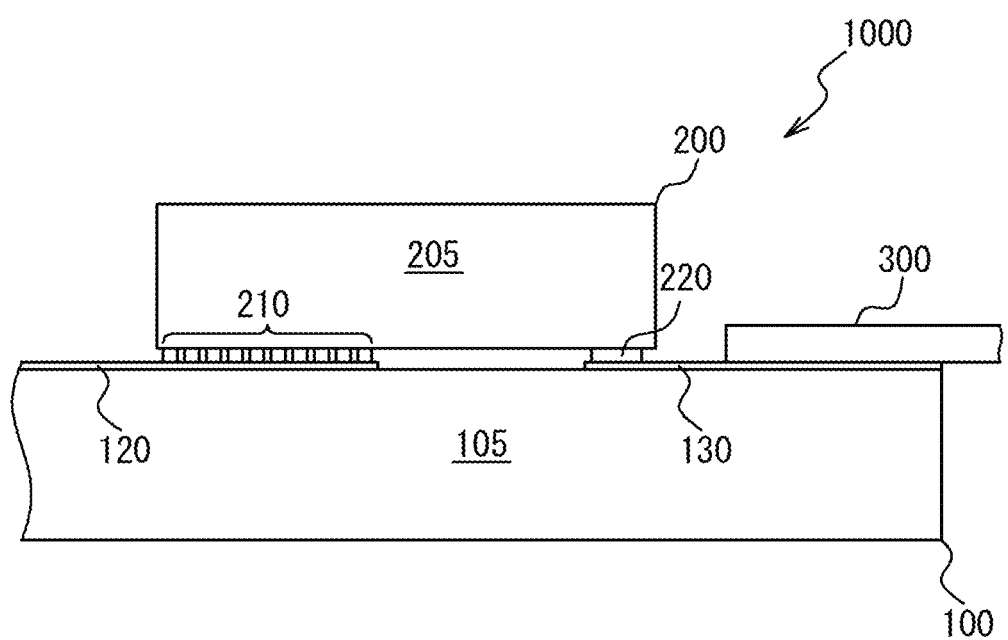
FIG. 3 is a partial enlarged side view of a display module, according to one or more embodiments.

FIG. 3 is a partial enlarged side view of the display module 1000, which shows the bonding of the display driver 200 to the display panel 100, according to one or more embodiments. In the shown embodiment, the display driver 200 is integrated within a semiconductor chip 205. To achieve flip-chip bonding, bump arrays 210 and 220 are formed on the main surface of the semiconductor chip 205. The main surface referred herein is the surface that faces the display panel 100. The bump array 210 includes a set of bumps used by the display driver 200 to output signals (e.g., data voltages used to update the pixels) to components on the display panel 100. Accordingly, the bump array 210 may be hereinafter also referred to as the output bump array 210. The bump array 220 includes a set of bumps that are used to input data and/or signals (e.g., display data, control data, control signals, and other data/signals) to the display driver 200. Accordingly, the bump array 220 may be hereinafter also referred to as the input bump array 220. The display panel 100 includes a substrate 105 and conductors 120 and 130 formed on the substrate 105. The bumps of the output bump array 210 are bonded to the conductors 120, and the bumps of the input bump array 220 are bonded to the conductors 130. Anisotropic conductive film (ACF) layers (not shown) may be used to bond the bump arrays 210 and 220 to the conductors 120 and 130. The conductors 120 are used to provide signals from the display driver 200 to relevant components of the display panel 100 (e.g., pixels) while the conductors 130 are used to provide signals and/or data (e.g., the image data, control data and/or control signals) to the display driver 200.

Figure 4:
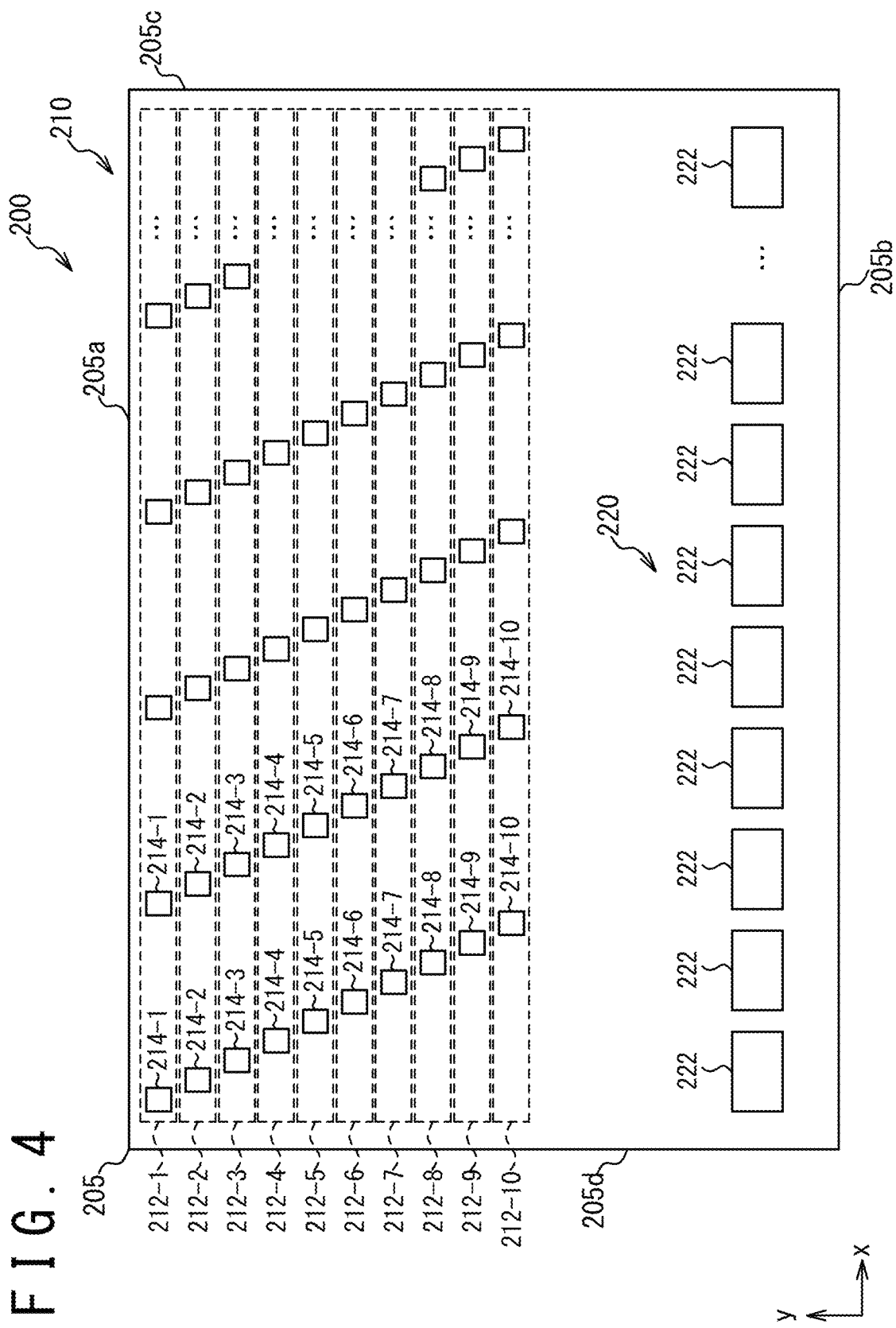
FIG. 4 shows example arrangements of bump arrays, according to one or more embodiments.

FIG. 4 shows example arrangements of the bump arrays 210 and 220 on the main surface of the semiconductor chip 205, according to one or more embodiments. In FIG. 4 (and subsequent figures), directions may be specified with x- and y-axes defined perpendicular to each other. In the shown embodiment, the main surface of the semiconductor chip 205 has a rectangular shape with long edges 205a, 205b and short edges 205c and 205d. The long edges 205a and 205b are oriented in a first direction parallel to the x-axis (which may also be referred to as the horizontal direction) while the short edges 205c and 205d are oriented in a second direction parallel to the y-axis (which may also be referred to as the vertical direction). The semiconductor chip 205 is arranged such that the long edge 205a faces the active area 110 of the display panel 100.

The output bump array 210 has a "staggered" bump arrangement as described below in detail. The output bump array 210 includes a plurality of bump rows 212 each including a plurality of bumps 214 aligned in the horizontal direction, wherein the corresponding bumps 214 in adjacent bump rows 212 are located offset from each other in the horizontal direction. In the shown embodiment, the output bump array 210 includes ten bump rows 212-1, 212-2, 212-3, 212-4, 212-5, 212-6, 212-7, 212-8, 212-9, and 212-10. The bump row 212-1 is the closest of the bump rows 212 to the long edge 205a, the bump row 212-2 is the second closest to the long edge 205a, the bump row 212-3 is the third closest to the long edge 205a, and similarly for the rest. The bump row 212-10 is the farthest from the long edge 205a. Each of the bump rows 212-1 to 212-10 includes a plurality of bumps 214 aligned in the horizontal direction. The bumps 214-2 of the bump row 212-2 are located offset from the corresponding bumps 214-1 of the bump row 212-1 in the horizontal direction, the bumps 214-3 of the bump row 212-3 are located offset from the corresponding bumps 214-2 of the bump row 212-2 in the horizontal direction, and similarly for the rest. While FIG. 4 shows ten bump rows 212, the output bump array 210 may include less or more than ten bump rows.

The input bump array 220 includes a row of bumps 222 aligned along the long edge 205b of the semiconductor chip 205. While FIG. 4 shows one row of bumps 222, the input bump array 220 may include a plurality of rows of bumps, which may be arranged in a staggered arrangement.

Figure 5:
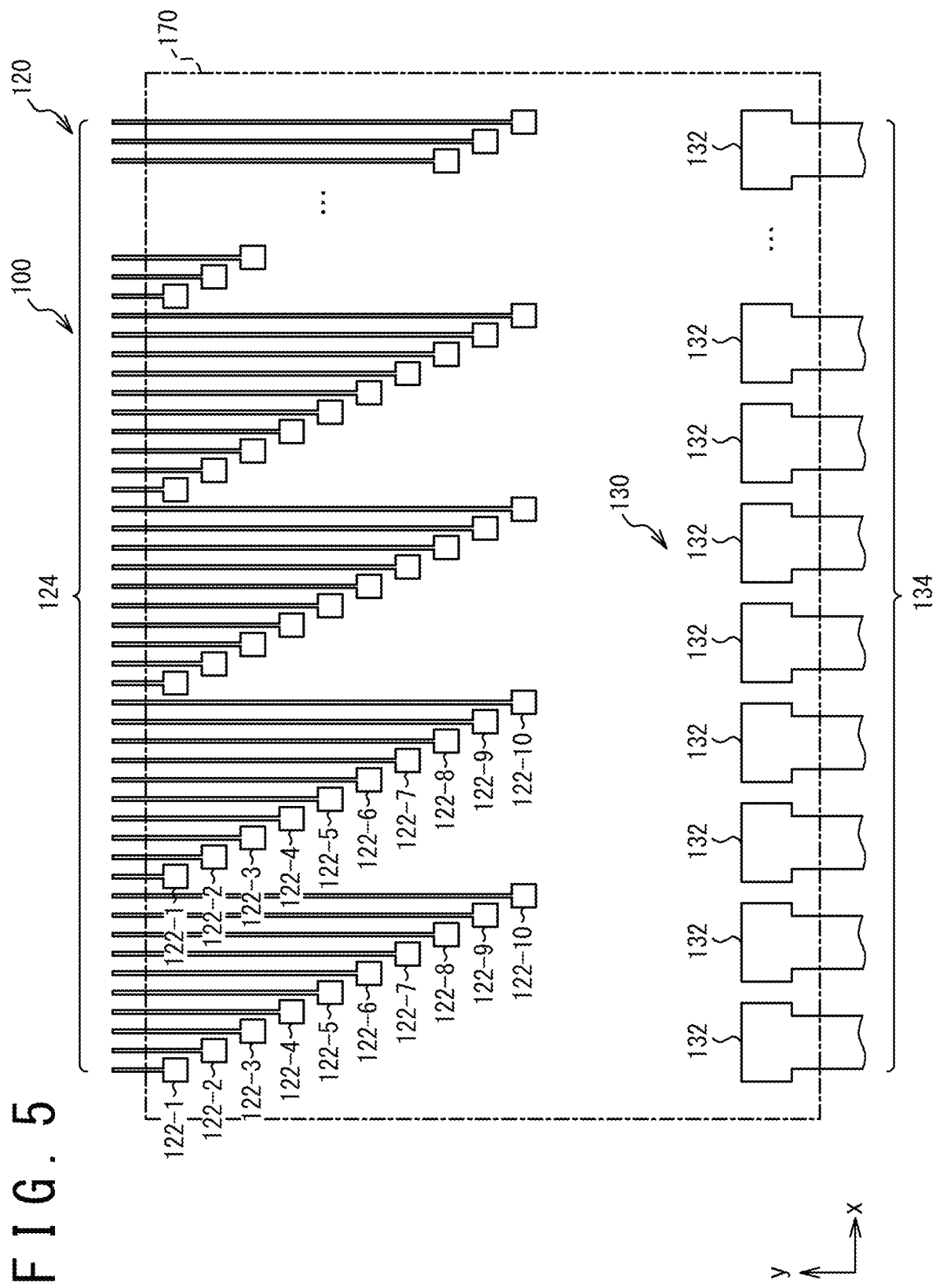
FIG. 5 shows an example layout of conductors on a display panel, according to one or more embodiments.

FIG. 5 shows example layouts of the conductors 120 and 130 on the display panel 100, according to one or more embodiments. In FIG. 5, the dashed-dotted box 170 indicates the area on which the display driver 200 is mounted.

The conductors 120 include an array of bond pads 122-1, 122-2, 122-3, 122-4, 122-5, 122-6, 122-7, 122-8, 122-9, and 120-10. The bond pads 122-1 are placed at the locations corresponding to the bumps 214-1 of the bump row 212-1, which is the closest to the long edge 205a of the semiconductor chip 205 as shown in FIG. 4. In other words, the bond pads 122-1 are bonded to the bumps 214-1 of the bump row 212-1 when the display driver 200 is mounted on the display panel 100. Correspondingly, the bond pads 122-i are placed at the locations corresponding to the bumps 214-i of the bump row 212-i for any natural number i between 2 and 10, inclusive. The bond pads 122-i are bonded to the bumps 214-i of the bump row 212-i when the display driver 200 is mounted on the display panel 100.

The bond pads 122-1 through 122-10 are coupled to routing traces 124, respectively. The routing traces 124 are coupled to components disposed on the display panel 100 (e.g., the components shown in FIG. 6) to provide signals output from the bumps 214 of the display driver 200 to the components.

Figure 6:
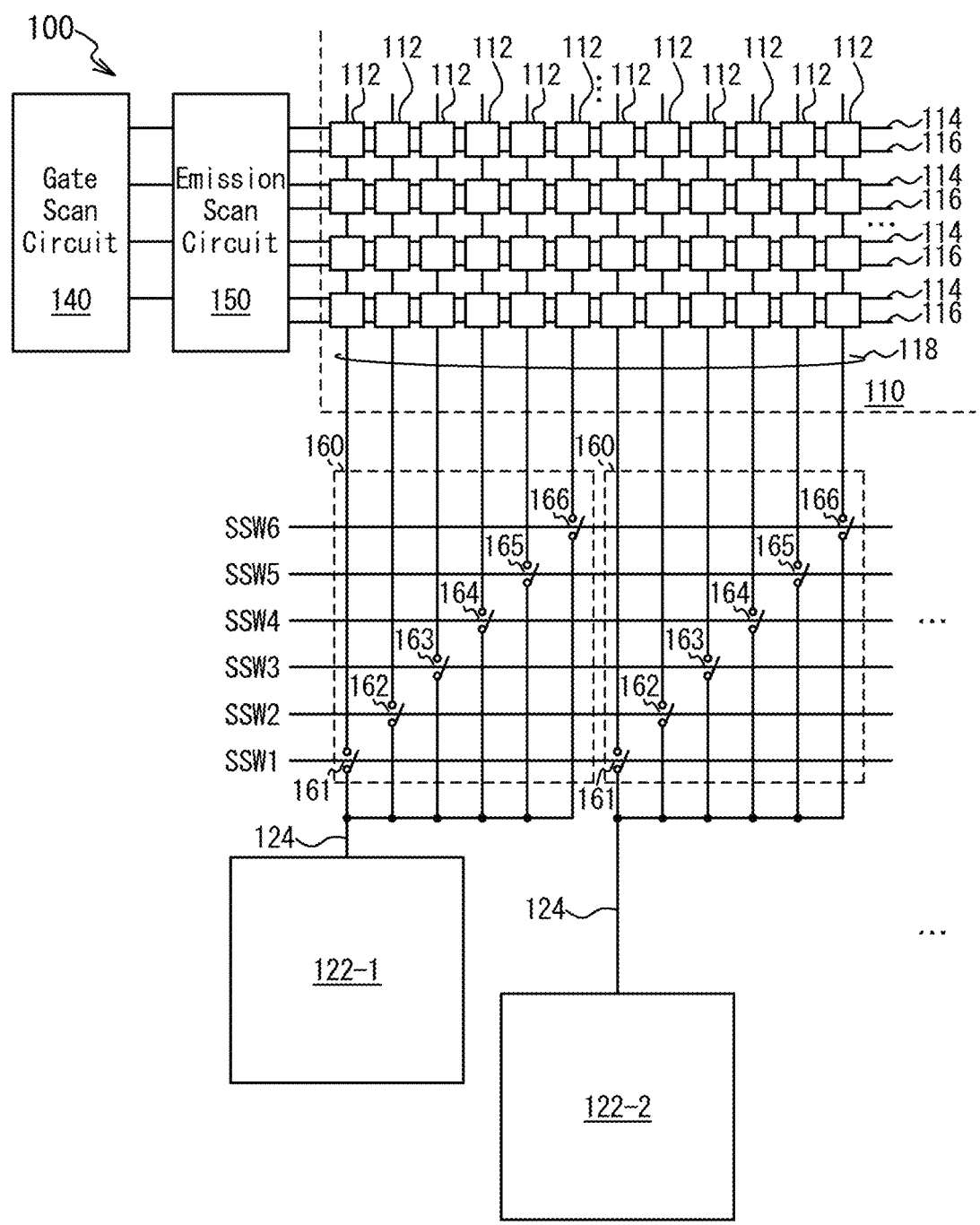
FIG. 6 shows an example partial configuration of a display panel, according to one or more embodiments.

FIG. 6 shows an example partial configuration of the display panel 100, according to one or more embodiments. Although FIG. 6 only shows the configuration of part of the active area 110 of the display panel 100 associated with the bond pads 122-1 and 122-2, persons skilled in the art would appreciate that the rest of the active area 110 may be similarly configured.

In the shown embodiment, the display panel 100 is configured as an OLED display panel. The active area 110 of the display panel 100 includes a plurality of pixels 112 each including an OLED element, a plurality of gate lines 114 (which may be also referred to as scan lines), a plurality of emission lines 116, and a plurality of source lines 118. The gate lines 114 and the emission lines 116 extend in the horizontal direction (parallel to the x axis) while the source lines 118 extend in the vertical direction (parallel to the y axis). The pixels 112 are arranged in rows and columns at intersections of the gate lines 114 and the source lines 118 and each configured to emit light of a particular color, such as red, green, or blue. The luminance levels of the pixels 112 are adjusted based on data voltages received from the display driver 200 via the source lines 118. The pixels 112 are configured to be programmed by the data voltages to emit light with the luminance levels corresponding to the levels of the data voltages.

The gate lines 114 are used to select rows of pixels 112 to be programmed or updated with the data voltages. When a set of pixels 112 coupled to a particular gate line 114 is to be programmed or updated, the particular gate line 114 is asserted to allow the set of pixels 112 to receive the data voltages from the corresponding source lines 118. In embodiments where the gate lines 114 are driven with active low signals, a gate line 114 is asserted when the gate line 114 is set to the "low" level. Alternatively, in embodiments where the gate lines 114 are driven with active high signals, a gate line 114 is asserted when the gate line 114 is set to the "high" level.

The emission lines 116 are used to control light emission from the pixels 112. A set of pixels 112 coupled to a particular emission line 116 are configured to emit light when the particular emission line 116 is asserted. In embodiments where the emission lines 116 are driven with active low signals, an emission line 116 is asserted when the emission line 116 is set to the low level. Alternatively, in embodiments where the emission lines 116 are driven with active high signals, an emission line 116 is asserted when the emission line 116 is set to the high level.

The display panel 100 further includes a gate scan circuit 140, an emission scan circuit 150, and a plurality of multiplexers 160 (two shown). The gate scan circuit 140 is configured to scan the gate lines 114, that is, successively assert the gate lines 114 to select the rows of the pixels 112 to be programmed or updated. The emission scan circuit 150 is configured to scan the emission lines 116 to control light emission from the pixels 112 coupled to the respective emission lines 116.

The multiplexers 160 are configured to selectively couple the source lines 118 to the bond pads 122 when the pixels 112 are to be updated with data voltages received from the display driver 200. In the shown embodiment, each multiplexer 160 includes six switches 161, 162, 163, 164, 165, and 166 which are controlled by control signals SSW1, SSW2, SSW3, SSW4, SSW5, and SSW6, respectively. The switches 161, 162, 163, 164, 165, and 166 are configured to turn on in response to the control signals SSW1, SSW2, SSW3, SSW4, SSW5, and SSW6 being asserted, respectively. In the shown embodiment, each multiplexer 160 is configured to couple one or more source lines 118 selected from corresponding six source lines 118 to the corresponding bond pad 122 (e.g., the bond pads 122-1 and 122-2 shown in FIG. 6). When a pixel 112 coupled to a particular gate line 114 and a particular source line 118 is to be updated with a data voltage generated by the display driver 200, the corresponding multiplexer 160 couples the particular source line 118 to the corresponding bond pad 122 bonded to the corresponding bump 214 of the display driver 200.

The staggered arrangement of the bumps shown in FIG. 4 and the corresponding staggered arrangement of the bond pads shown in FIG. 5 result in variations in the lengths of the routing traces 124 coupled to the bond pads 122. For example, as shown in FIG. 5, the length of the routing traces 124 coupled to the bond pads 122-1, which are bonded to the bumps 214-1 of the bump row 212-1, is substantially different from the length of the routing traces 124 coupled to the bond pads 122-10, which are bonded to the bumps 214-10 of the bump row 212-10.

Figure 7:
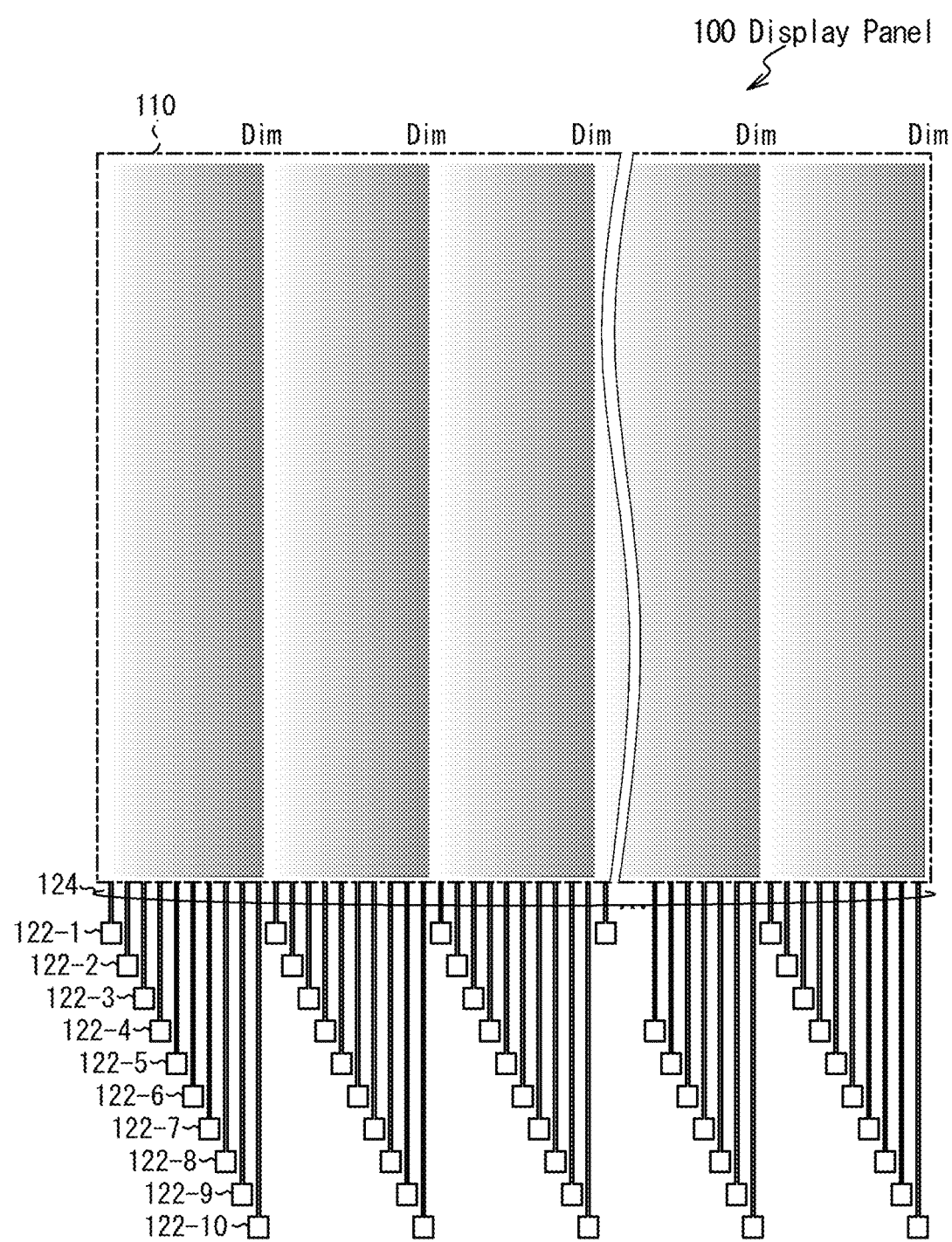
FIG. 7 shows example image artifacts that may appear in a display image displayed on a display panel.

In some implementations, the variations in the lengths of the routing traces 124 coupled to the bond pads 122 may generate variations in the resistances and/or capacitances of the routing traces 124, causing different effects on the data voltages provided to the pixels 112 via the routing traces 124. Accordingly, the variations in the resistances and/or capacitances of the routing traces 124 may cause image artifacts such as uneven image brightness. FIG. 7 shows an example image artifact that may appear in a display image displayed in the active area 110 of the display panel 100. In some implementations, the display image may be dim in the areas in which pixels are configured to receive data voltages via long routing traces 124.

In one or more embodiments, the display driver 200 is configured to provide pixel data compensation for mitigating image artifacts potentially caused by the variations in the resistances and/or capacitances of the routing traces 124 coupled to the bond pads 122. In one implementation, the display driver 200 may be configured to process input pixel data for a target pixel 112 of the display panel 100 to generate compensated pixel data and generate a data voltage for the target pixel 112 based on the compensated pixel data. The display driver 200 may be further configured to output the data voltage to the target pixel 112 via a particular bump 214 of the bump array 210. In the generation of the compensated pixel data for the target pixel 112, the input pixel data may be processed based on the location of the particular bump 214 in the bump array 210. More specifically, the processing of the input pixel data may be based on which of the bump rows 212 includes the particular bump 214. Such processing may compensate for the variations in the resistances and/or capacitances of the routing traces 124 coupled to the bond pads 122, effectively mitigating or eliminating image artifacts.

Figure 8:
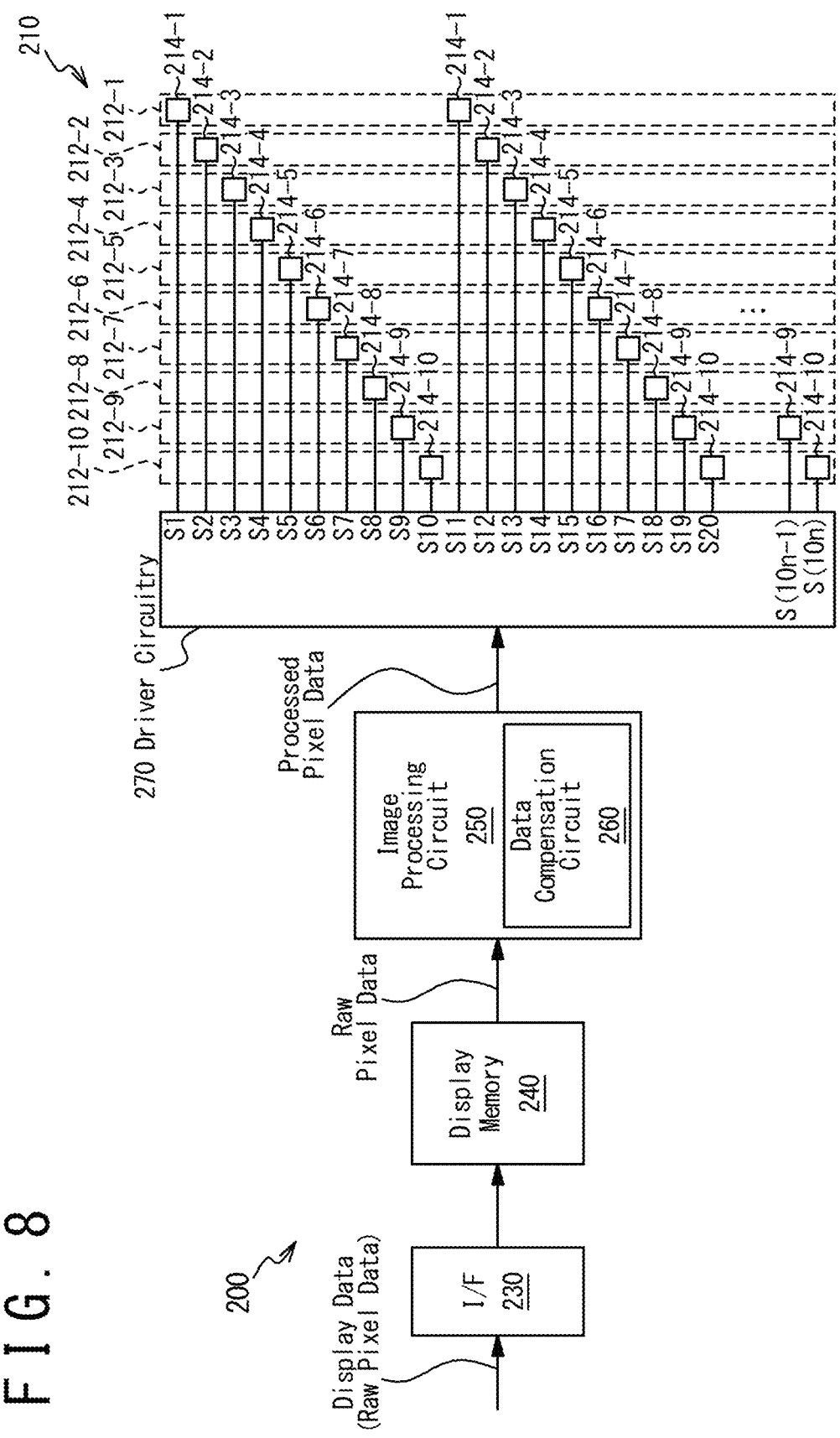
FIG. 8 shows an example configuration of a display driver adapted to pixel data compensation, according to one or more embodiments.

FIG. 8 shows an example configuration of the display driver 200 adapted to the pixel data compensation, according to one or more embodiments. In the shown embodiment, the display driver 200 includes an interface (I/F) 230, a display memory 240, an image processing circuit 250, and driver circuitry 270.

The interface 230 is configured to receive display data corresponding to a display image to be displayed on the display panel from an image source (not shown). The image source may be an application processor (AP), a central processing unit (CPU) or a different type of processor configured to generate the display data. The display data includes raw pixel data for the respective pixels. In one implementation, the raw pixel data for a pixel may include a grey level that specifies the desired luminance level of the pixel. The interface 230 is further configured to provide the display data to the display memory 240.

The display memory 240 is configured to store the display data received from the interface 230. The display memory 240 is further configured to provide the raw pixel data, which is included in the stored display data, to the image processing circuit 250. The image processing circuit 250 is configured to apply image processing to the raw pixel data to generate processed pixel data. The image processing circuit 250 includes a data compensation circuit 260 configured to provide pixel data compensation for mitigating the above-discussed image artifacts potentially caused by the staggered bump arrangement. Details of the configuration and operation of the data compensation circuit 260 will be described later. The image processing performed by the image processing circuit 250 may further include color adjustment, demura correction, deburn correction, image scaling, gamma transformation, or other image processes.

The driver circuitry 270 is configured to generate data voltages for respective pixels 112 (shown in FIG. 6) based on the processed pixel data received from the image processing circuit 250. In one implementation, the data voltage for a particular pixel 112 may be generated based on the grey level of the processed pixel data for the particular pixel 112. The driver circuitry 270 is configured to output the data voltages to the respective pixels 112 via the bumps 214 of the output bump array 210. It is noted that the bumps 214 are coupled to the pixels 112 via the bond pads 122, the routing traces 124, the multiplexers 160, and the source lines 118 (also see FIG. 6). As described above, the bumps 214 of the output bump array 210 are arranged in a staggered arrangement. In the shown embodiment, the driver circuitry 270 is configured as a source driver having source outputs S1 to S(10n) coupled to the bumps 214 arranged in ten bump rows 212, where n is an integer. For any integers j between 1 and n, inclusive, the source outputs S(10j-9) are coupled to the bumps 214-1 in the bump row 212-1, the source outputs S(10j-8) are coupled to the bumps 214-2 in the bump row 212-2, the source outputs S(10j-7) are coupled to the bumps 214-3 in the bump row 212-3, and similarly for the rest.

Figure 9A:
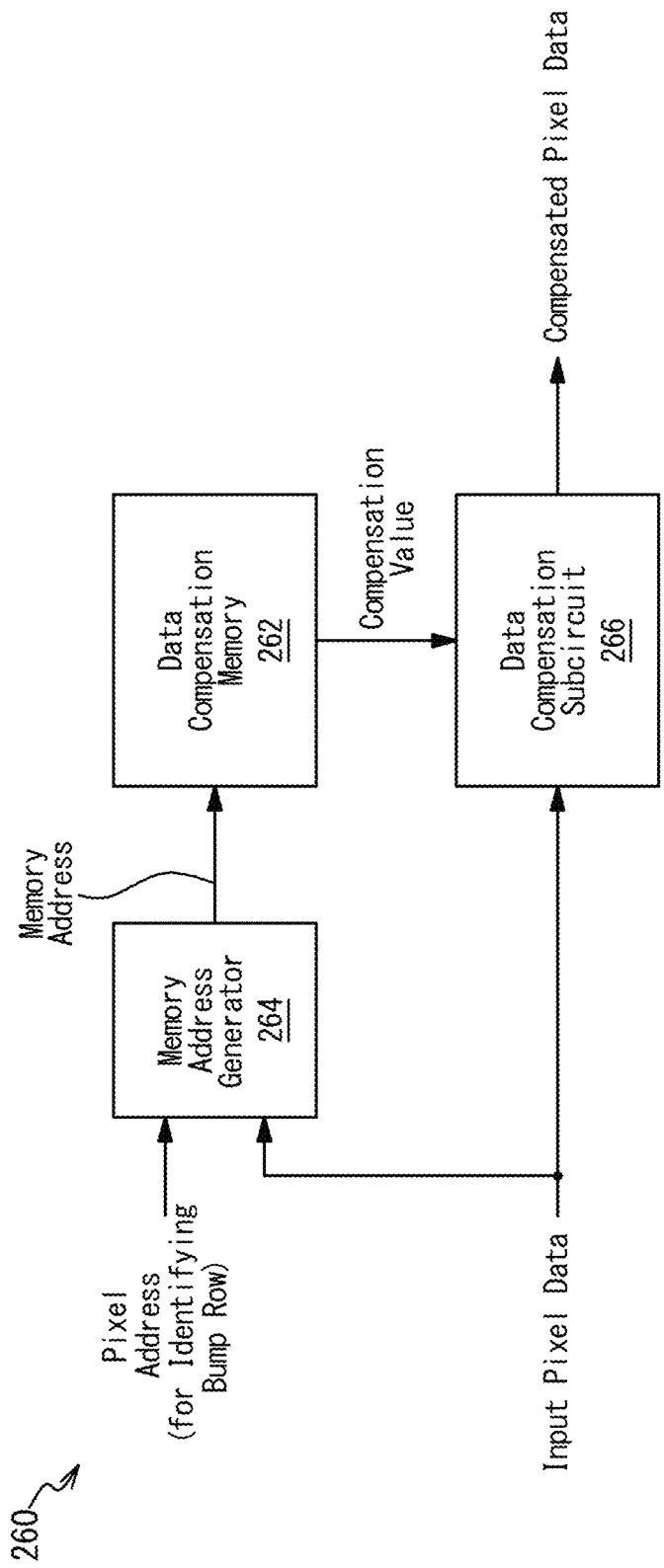
FIG. 9A shows an example configuration of a data compensation circuit, according to one or more embodiments.

FIG. 9A shows an example configuration of the data compensation circuit 260, according to one or more embodiments. In the shown embodiment, the data compensation circuit 260 is configured to receive input pixel data and apply pixel data compensation to the input pixel data to generate compensated pixel data. The input pixel data may be the raw pixel data or may be generated by applying one or more other image processes (e.g., color adjustment, demura correction, deburn correction, image scaling, or other image processes) to the raw pixel data in the image processing circuit 250 (shown in FIG. 8). The compensated pixel data may be used as the processed pixel data provided to the driver circuitry 270, which is configured to update the pixels of the display panel 100 based on the processed pixel data. Alternatively, the compensated pixel data may be further processed (e.g., color adjustment, demura correction, deburn correction, image scaling, gamma transformation or other image processes) and then provided to the driver circuitry 270 as the processed pixel data.

In the shown embodiment, the data compensation circuit 260 is configured to determine a compensation value for a particular pixel 112 based on the location of the bump 214 via which the driver circuitry 270 outputs the drive voltage to the particular pixel 112. In one implementation, for a particular pixel 112 to which the driver circuitry 270 outputs the drive voltage via a particular bump 214, the compensation value for the particular pixel 112 may be determined based on which of the bump rows 212 includes the particular bump 214. The data compensation circuit 260 is further configured to apply the compensation value to the input pixel data for the particular pixel 112 to generate compensated pixel data for the particular pixel 112. The data voltage for the particular pixel 112 is generated based on the compensated pixel data.

In the shown embodiment, the data compensation circuit 260 includes a data compensation memory 262 and a memory address generator 264 to determine compensation values for the respective pixels. In one or more embodiments, the data compensation memory 262 may be configured to store a plurality of possible compensation values in predefined memory addresses. The memory address generator 264 may be configured to identify which of the bump rows 212 includes the particular bump 214 based on the pixel address of the particular pixel 112 and determine a memory address based on the identified bump row 212. The data compensation memory 262 may be further configured to output the compensation value in the memory address determined by the memory address generator 264.

The data compensation circuit 260 further includes a data compensation subcircuit 266 configured to receive the compensation values from the data compensation memory 262 and apply the compensation values to the input pixel data for the respective pixels to generate the compensated pixel data for the respective pixels. In one implementation, the data compensation subcircuit 266 may be configured to generate the compensated pixel data for a particular pixel 112 such that the grey level of the compensated pixel data is the sum of the grey level of the input pixel data for the particular pixel 112 and the compensation value for the particular pixel 112. In an alternative implementation, the data compensation subcircuit 266 may be configured to generate the compensated pixel data for the particular pixel 112 by applying a different arithmetic operation (e.g., multiplication) to the input pixel data based on the compensation value.

In one or more embodiments, the compensation values for the respective pixels 112 may be determined further based on input pixel data for the pixels 112. In one implementation, in the determination of the compensation value for a particular pixel 112, the memory address generator 264 is configured to determine the memory address further based on the grey level of the input pixel data for the particular pixel 112 in addition to the identified bump row. The data compensation memory 262 may be configured to output the compensation value in the memory address thus determined by the memory address generator 264.

In some embodiments, the sign (either positive or negative) of the compensation value may indicate the direction of compensation. The direction of compensation may correspond to whether the grey level of the compensated pixel data is greater than or less than the grey level of the input pixel data. Hereinafter, the direction of compensation is defined as positive when the grey level of the compensated pixel data is greater than the grey level of the input pixel data, and is defined as negative when the grey level of the compensated pixel data is less than the grey level of the input pixel data. Meanwhile, the absolute value of the compensation value may indicate the magnitude of compensation. The magnitude of compensation may correspond to the absolute difference between the grey level of the compensated pixel data and the grey level of the input pixel data.

The sign of the compensation value (i.e., the direction of compensation) for a particular pixel 112 may be determined based on which of the bump rows 212 includes a corresponding bump 214 via which the drive voltage is output to the particular pixel 112. In one implementation, the sign of the compensation value for the particular pixel 112 may be positive when any of a predetermined number of bump rows 212 located farthest from the edge 205a of the semiconductor chip 205 (e.g., the bump rows 212-6 through 212-10 in FIG. 4) includes the corresponding bump 214. The sign of the compensation value for the particular pixel 112 may be negative when any of a predetermined number of bump rows 212 located closest to the edge 205a of the semiconductor chip 205 (e.g., the bump rows 212-1 through 212-5 in FIG. 4) includes the corresponding bump 214.

The absolute value of the compensation value (i.e., the magnitude of compensation) for a particular pixel 112 may be determined based on which of the bump rows 212 includes a corresponding bump 214 via which the drive voltage is output to the particular pixel 112. In one implementation, when the sign of the compensation value (i.e., the direction of compensation) for the particular pixel 112 is positive, the absolute value of the compensation value for the particular pixel 112 may increase as the distance of the bump row 212 including the corresponding bump 214 from the edge 205a of the semiconductor chip 205 increases. In one implementation, when the sign of the compensation value (i.e., the direction of compensation) for the particular pixel 112 is negative, the absolute value of the compensation value for the particular pixel 112 may increase as the distance of the bump row 212 including the corresponding bump 214 from the edge 205a of the semiconductor chip 205 decreases.

The absolute value of the compensation value (i.e., magnitude of compensation) for the particular pixel 112 may be determined further based on the grey level of the input pixel data for the particular pixel 112. In one or more embodiments, the absolute value of the compensation value may be determined based on the absolute difference between the grey level of the input pixel data and an "equalization grey level" $GL_{OFS}$, which is described in detail below with reference to FIG. 9B.

Figure 9B:
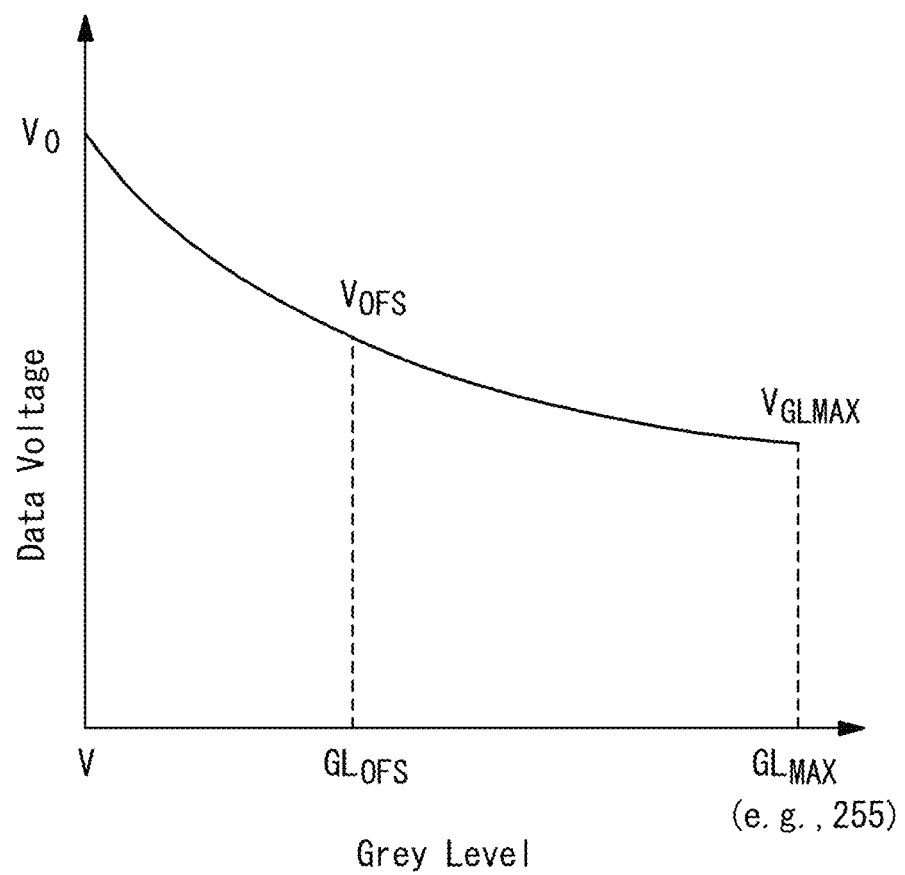
FIG. 9B shows an example relationship between the grey level and the data voltage and an example definition of an equalization grey level, according to one or more embodiments.

FIG. 9B shows an example relationship between the grey level and the data voltage generated by the driver circuitry 270 and an example definition of the "equalization grey level" $GL_{OFS}$, according to one or more embodiments. The "equalization grey level" $GL_{OFS}$ is a grey level that causes the driver circuitry 270 (shown in FIG. 8) to generate a data voltage equal to an equalization voltage $V_{OFS}$, which is a predetermined voltage used for "equalization" of the source lines 118 (shown in FIG. 6). "Equalization" is a process of equalizing the charges on the source lines 118 by driving the source lines 118 to the equalization voltage $V_{OFS}$ at the beginning of each horizontal sync period. In one implementation, the driver circuitry 270 is configured to generate and provide the equalization voltage $V_{OFS}$ to the source lines 118 during the "equalization" process. Details of the equalization process will be described later with reference to FIG. 11.

In the embodiment shown in FIG. 9B, the driver circuitry 270 is configured to generate a data voltage of $V_0$ for the grey level "0" and a data voltage of $V_{GLMAX}$ for the maximum grey level (e.g., "255"). In this embodiment, the data voltage generated by the driver circuitry 270 decreases as the grey level increases. The "equalization grey level" $GL_{OFS}$ is defined as an intermediate grey level that causes the driver circuitry 270 to generate the data voltage equal to the equalization voltage $V_{OFS}$.

In one or more embodiments, the absolute value of the compensation value may be determined based on the absolute difference between the grey level of the input pixel data and an "equalization grey level" $GL_{OFS}$. In one implementation, the absolute value of the compensation value for the particular pixel 112 may increase with an increase in the absolute difference between the equalization grey level $GL_{OFS}$ and the grey level of the input pixel data for the particular pixel 112. The absolute value of the compensation value for the particular pixel 112 may decrease with a decrease in the absolute difference between the equalization grey level $GL_{OFS}$ and the grey level of the input pixel data for the particular pixel 112. Determining the absolute value of the compensation value for the particular pixel 112 based on the absolute difference between the grey level of the input pixel data and the equalization grey level $GL_{OFS}$ may effectively enhance the effect of the pixel data compensation to mitigate or reduce image artifacts.

Figure 10A:
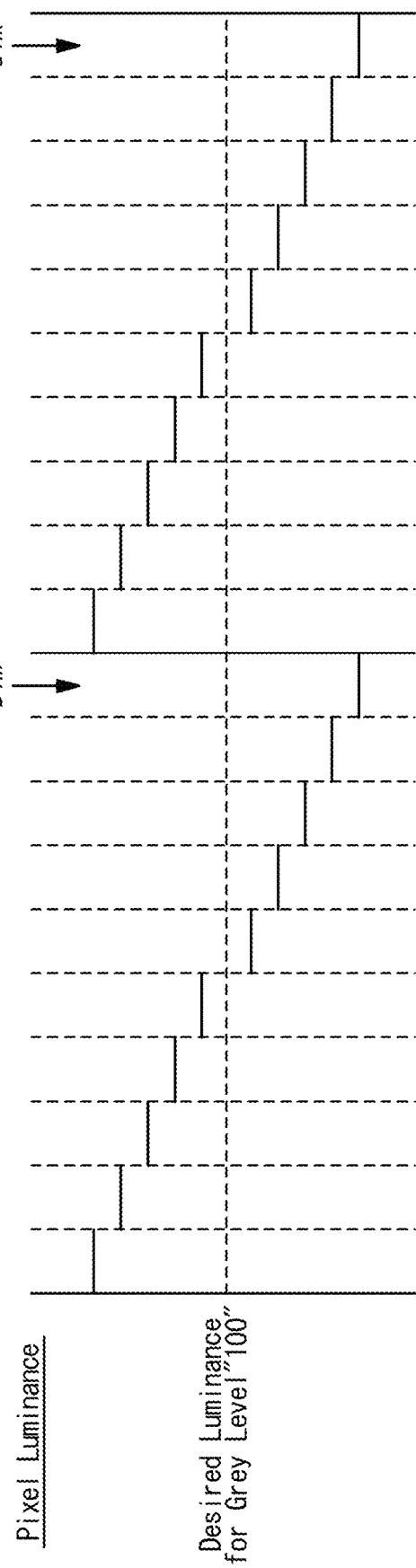
FIG. 10A shows example variations in the pixel luminance levels for a fixed grey level without pixel data compensation.

FIG. 10A shows example variations in the pixel luminance levels for a fixed grey level ("100" in the shown example) of input pixel data without pixel data compensation. In FIG. 10A (and FIG. 10B), "S1" indicates a pixel coupled to the source output S1, which is coupled to a bump 214-1 in the bump row 212-1 (also see FIGS. 4 and 8), "S2" indicates a pixel coupled to the source output S2, which is coupled to a bump 214-2 in the bump row 212-2, "S3" indicates a pixel coupled to the source output S3, which is coupled to a bump 214-3 in the bump row 212-3, and similarly for the rest.

The pixel luminance levels of respective pixels for the fixed grey level depend on which of the bump rows 212 include the bumps 214 via which the driver circuitry 270 outputs the corresponding drive voltages to the pixels. In the shown embodiment, the pixel luminance levels decrease as the bumps 214 via which the driver circuitry 270 outputs the drive voltages to the pixels are located in the bump rows 212 farther from the edge 205a of the semiconductor chip 205 (also see FIGS. 4 and 8). This is because the lengths of the routing traces 124 coupled to the bond pads 122 to which the bumps 214 are bonded increase as the bumps 214 are located farther from the edge 205a of the semiconductor chip 205. For example, the pixels "S10" and "S20", to which the driver circuitry 270 outputs the data voltages via corresponding bumps 214-10 in the bump row 212-10, exhibit the minimum pixel luminance. This is because the bump row 212-10 is the farthest from the edge 205a of the semiconductor chip 205 and therefore the routing traces 124 coupled to the corresponding bond pads 122-10 are the longest. Meanwhile, pixels "S1" and "S11", to which the driver circuitry 270 outputs the data voltages via corresponding bumps 214-1 in the bump row 212-1, exhibit the maximum pixel luminance. This is because the bump row 212-1 is the closest to the edge 205a of the semiconductor chip 205 and therefore the routing traces 124 coupled to the corresponding bond pads 122-1 are the shortest. The variations in the pixel luminance level undesirably generate dim portions in the display image, resulting in uneven image brightness.

FIG. 10B shows example pixel data compensation for a fixed grey level ("100" in the shown example) of input pixel data, according to one or more embodiments. In the shown embodiment, the pixel data compensation of the input pixel data for respective pixels is based on which of the bump rows 212 include the bumps 214 via which the driver circuitry 270 outputs the drive voltages to the pixels. In the shown embodiment, the compensated pixel data for pixels "S6" to "S10" and "S16" to "S20", which would exhibit relatively lower pixel luminance without the pixel data compensation as shown in FIG. 10A, are generated such that the grey levels of the compensated pixel data for pixels "S6" to "S10" and "S16" to "S20" are greater than the original grey level of the input pixel data. In other words, the direction of the compensation for the pixels "S6" to "S10" and "S16" to "S20" is positive. It is noted that pixels "S10" and "S20" are coupled to bumps 214-10 of the bump row 212-10, which is located farthest from the edge 205a of the semiconductor chip 205. Meanwhile, the compensated pixel data for pixels "S1" to "S5" and "S11" to "S15", which would exhibit relatively higher pixel luminance without the pixel data compensation, are generated such that the grey levels of the compensated pixel data for pixels "S1" to "S5" and "S11" to "S15" are less than the original grey level of the input pixel data. In other words, the direction of the compensation for the pixels "S1" to "S5" and "S11" to "S15" is negative. It is noted that pixels "S1" and "S11" are coupled to bumps 214-1 of the bump row 212-1, which is located closest to the edge 205a of the semiconductor chip 205.

In one implementation, the pixel data compensation may be performed such that the grey levels of the compensated pixel data for respective pixels increase as the bumps 214 via which the driver circuitry 270 outputs the drive voltages to the pixels are located in the bump rows 212 farther from the edge 205a of the semiconductor chip 205 (also see FIGS. 4 and 8). For example, the compensated pixel data for pixels "S10" and "S20", which would exhibit the minimum pixel luminance without the pixel data compensation, may be generated such that the grey level of the compensated pixel data for pixels "S10" and "S20" is the largest of the grey levels of the compensated pixel data for pixels "S1" through "S20". The compensated pixel data for pixels "S9" and "S19", which would exhibit the second minimum pixel luminance without the pixel data compensation, may be generated such that the grey level of the compensated pixel data for pixels "S9" and "S19" is the second largest. Meanwhile, the compensated pixel data for pixels "S1" and "S11", which would exhibit the maximum pixel luminance without the pixel data compensation, may be generated such that the grey level of the compensated pixel data for pixels "S1" and "S11" is the smallest. Further, the compensated pixel data for pixels "S2" and "S12", which would exhibit the second maximum pixel luminance without the pixel data compensation, may be generated such that the grey level of the compensated pixel data for pixels "S2" and "S12" is the second smallest. In one implementation, the pixel data compensation effectively mitigates the unevenness in the display image potentially caused by the variations in the lengths of the routing traces 124 coupled to the bond pads 122 resulting from the staggered bump arrangement.

The pixel luminance levels of the respective pixels may also depend on the voltage levels on the source lines 118 just before the drive voltages to be provided to the pixels are driven on the source lines 118. Variations in the voltage levels on the source lines 118 may undesirably degrade the effect of the pixel data compensation discussed above.

To enhance the effect of the pixel data compensation, in one or more embodiments, the source lines 118 may be electrically "equalized" before driving the data voltages on the source lines 118 in each horizontal synchronization period. As discussed above, the "equalization" of the source lines 118 may be achieved by driving all the source lines 118 to the equalization voltage $V_{OFS}$ by the driver circuitry 270 at the beginning of each horizontal sync period. In one implementation, all the switches 161 to 166 of the multiplexers 160 (shown in FIG. 6) may be turned on by asserting all of the control signals SSW1 to SSW6 and the equalization voltage $V_{OFS}$ may be provided to all the source lines 118 via the switches 161 to 166 to achieve the equalization of the source lines 118.

Figure 11:
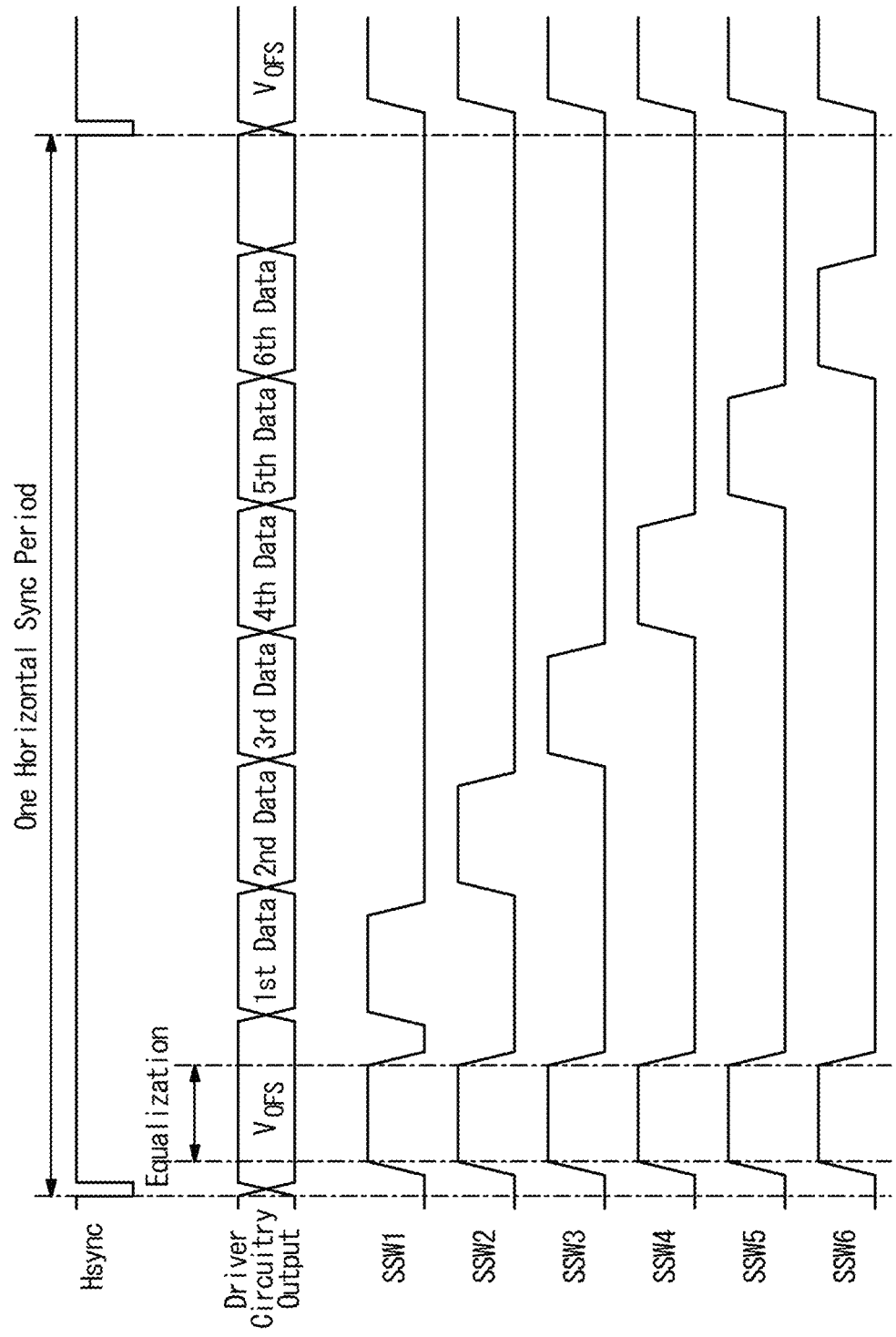
FIG. 11 is a timing diagram showing an example procedure of source line equalization, according to one or more embodiments.

FIG. 11 shows a timing diagram showing an example procedure of equalization of the source lines 118 during a horizontal sync period, according to one or more embodiments. In FIG. 11, "Hsync" refers to a horizontal sync signal used to define horizontal sync periods in the display driver 200. The horizontal sync signal Hsync is asserted (in the shown embodiment, set to the "low" level) at the beginning of the horizontal sync period. In response to the assertion of the horizontal sync signal Hsync, all the control signals SSW1 to SSW6 are asserted to turn on all the switches 161 to 166 of the multiplexers 160. In the meantime, the equalization voltage V OFS is provided from the driver circuitry 270 to all the source lines 118 via the switches 161 to 166 to achieve "equalization" of the source lines 118.

After the equalization of the source lines 118, "selected" pixels 112 are programmed or updated with data voltages received from the driver circuitry 270 in a time-division manner. The "selected" pixels 112 referred herein are a set of pixels 112 coupled to a gate line 114 selected during the horizontal sync period. In FIG. 11, "1st Data", "2nd Data", "3rd Data", "4th Data", "5th Data", and "6th Data" refer to data voltages for pixels 112 coupled to the source lines 118 corresponding to the switches 161, 162, 163, 164, 165, and 166, which are coupled to the control signals SSW1, SSW2, SSW3, SSW4, SSW5, and SSW6, respectively. In the shown embodiment, the control signals SSW1, SSW2, SSW3, SSW4, SSW5, and SSW6 are shown as active high signals and therefore the control signals SSW1, SSW2, SSW3, SSW4, SSW5, and SSW6 are set to the "high" level when the control signals SSW1, SSW2, SSW3, SSW4, SSW5, and SSW6 are asserted.

In the shown embodiment, the control signal SSW1 is first asserted to turn on the switches 161, and the selected pixels 112 coupled to the switches 161 are programmed or updated with the data voltages "1st Data". The control signal SSW2 is then asserted to turn on the switches 162, and the selected pixels 112 coupled to the switches 162 are programmed or updated with the data voltages "2nd Data". A similar goes for the rest. The selected pixels 112 coupled to the switches 163 are then programmed or updated with the data voltages "3rd Data" while the control signal SSW3 is asserted, and then the selected pixels 112 coupled to the switches 164 are programmed or updated with the data voltages "4th Data" while the control signal SSW4 is asserted. The selected pixels 112 coupled to the switches 165 are then programmed or updated with the data voltages "5th Data" while the control signal SSW5 is asserted, and then the selected pixels 112 coupled to the switches 166 are programmed or updated with the data voltages "6th Data" while the control signal SSW6 is asserted.

FIG. 12 shows a flowchart depicting an example method 1200 for pixel luminance compensation, according to one or more embodiments. While the various steps in the flowchart are presented and described sequentially, one of ordinary skill will appreciate that some or all of the steps may be executed in different orders, may be combined or omitted, and some or all of the steps may be executed in parallel. Additional steps may further be performed. Accordingly, the scope of the disclosure should not be considered limited to the specific arrangement of steps shown in FIG. 12.

The method 1200 includes processing, by a display driver (e.g., the display driver 200 shown in FIGS. 1-4 and 8), input pixel data for a pixel (e.g., a pixel 112 shown in FIG. 6) of a display panel (e.g., the display panel 100 shown in FIGS. 1-3 and 5-6) to generate compensated pixel data at step 1202. The processing of the input pixel data to generate the compensated pixel data is based on a location of a bump (e.g., the bumps 214 shown in FIG. 4) coupled to the pixel in a bump array (e.g., the bump array 210 shown in FIG. 4) of the display driver. The bump array has a staggered bump arrangement. The method 1200 further includes generating a data voltage based on the compensated pixel data at step 1204. The method 1200 further includes outputting the data voltage to the pixel via the bump at step 1206.

In embodiments where the display driver is integrated within a semiconductor chip (e.g., the semiconductor chip 205 shown in FIG. 4), the bump array may include a plurality of bump rows each including a set of bumps aligned in a first direction (e.g., the direction of the x axis in FIG. 4) parallel to an edge of the semiconductor chip. The plurality of bump rows may be aligned in a second direction (e.g., the direction of the y axis in FIG. 4) perpendicular to the first direction. In such embodiments, processing the input pixel data may be based on which of the plurality of bump rows includes the bump.

While many embodiments have been described, those skilled in the art, having benefit of this disclosure, will appreciate that other embodiments can be devised which do not depart from the scope. Accordingly, the scope of the invention should be limited only by the attached claims.

What is claimed is:

1. A display driver, comprising:
   a bump array with a staggered bump arrangement;
   a data compensation circuit to process input pixel data for a pixel of a display panel to generate compensated pixel data; and
   driver circuitry to:
   generate a data voltage based on the compensated pixel data, and
   output the data voltage to the pixel via a bump of the bump array,
   wherein processing the input pixel data to generate the compensated pixel data is based on a location of the bump in the bump array.

2. The display driver of claim 1, wherein processing the input pixel data to generate the compensated pixel data comprises:
   determining a compensation value based on the location of the bump in the bump array, and
   generating the compensated pixel data by applying the compensation value to the input pixel data.

3. The display driver of claim 2, wherein determining the compensation value is further based on the input pixel data.

4. The display driver of claim 1, wherein the display driver is integrated within a semiconductor chip,
wherein the bump array comprises a plurality of bump rows each comprising a set of bumps aligned in a first direction parallel to an edge of the semiconductor chip,
wherein the plurality of bump rows is aligned in a second direction perpendicular to the first direction, and
wherein processing the input pixel data is based on which of the plurality of bump rows comprises the bump.

5. The display driver of claim 4, wherein bumps of each bump row of the plurality of bump rows are located offset from corresponding bumps of an adjacent bump row of the plurality of bump rows in the first direction.

6. The display driver of claim 4, wherein generating the compensated pixel data comprises determining a grey level of the compensated pixel data based on the bump being comprised in a bump row out of the plurality of bump rows which is farthest from the edge of the semiconductor chip, and
wherein the determined grey level of the compensated pixel data is greater than a grey level of the input pixel data.

7. The display driver of claim 4, wherein generating the compensated pixel data comprises determining a grey level of the compensated pixel data based on the bump being comprised in a bump row out of the plurality of bump rows which is closest to the edge of the semiconductor chip, and
wherein the determined grey level of the compensated pixel data is less than a grey level of the input pixel data.

8. The display driver of claim 4, wherein processing the input pixel data to generate the compensated pixel data comprises:
determining a compensation value for the pixel based on which of the plurality of bump rows comprises the bump, and
generating the compensated pixel data by applying the compensation value to the input pixel data.

9. A display device, comprising:
a display panel; and
a display driver comprising a bump array with a staggered bump arrangement to:
process input pixel data for a pixel of the display panel to generate compensated pixel data,
generate a data voltage based on the compensated pixel data, and
output the data voltage to the pixel via a bump of the bump array,
wherein processing the input pixel data to generate the compensated pixel data is based on a location of the bump in the bump array.

10. The display device of claim 9, wherein processing the input pixel data to generate the compensated pixel data comprises:
determining a compensation value based on the location of the bump in the bump array, and
generating the compensated pixel data by applying the compensation value to the input pixel data.

11. The display device of claim 10, wherein determining the compensation value is further based on the input pixel data.

12. The display device of claim 9, wherein the display driver is integrated within a semiconductor chip,
wherein the bump array comprises a plurality of bump rows each comprising a set of bumps aligned in a first direction parallel to an edge of the semiconductor chip,
wherein the plurality of bump rows is aligned in a second direction perpendicular to the first direction, and
wherein processing the input pixel data to generate the compensated pixel data is based on which of the plurality of bump rows comprises the bump.

13. The display device of claim 12, wherein bumps of each bump row of the plurality of bump rows are located offset from corresponding bumps of an adjacent bump row of the plurality of bump rows in the first direction.

14. The display device of claim 12, wherein generating the compensated pixel data comprises determining a grey level of the compensated pixel data based on the bump being comprised in a bump row out of the plurality of bump rows which is farthest from the edge of the semiconductor chip, and
wherein the determined grey level of the compensated pixel data is greater than a grey level of the input pixel data.

15. The display device of claim 12, wherein generating the compensated pixel data comprises determining a grey level of the compensated pixel data based on the bump being comprised in a bump row out of the plurality of bump rows which is closest to the edge of the semiconductor chip, and
wherein the determined grey level of the compensated pixel data is less than a grey level of the input pixel data.

16. The display device of claim 12, wherein processing the input pixel data to generate the compensated pixel data comprises:
determining a compensation value for the pixel based on which of the plurality of bump rows comprises the bump, and
generating the compensated pixel data by applying the compensation value to the input pixel data.

17. A method, comprising:
processing, by a display driver, input pixel data for a pixel of a display panel to generate compensated pixel data, wherein processing the input pixel data to generate the compensated pixel data is based on a location of a bump in a bump array of the display driver, wherein the bump is coupled to the pixel, and wherein the bump array has a staggered bump arrangement;
generating a data voltage based on the compensated pixel data; and
outputting the data voltage to the pixel via the bump.

18. The method of claim 17, wherein processing the input pixel data to generate the compensated pixel data comprises:
determining a compensation value based on the location of the bump in the bump array, and
generating the compensated pixel data by applying the compensation value to the input pixel data.

19. The method of claim 18, wherein determining the compensation value is further based on the input pixel data.

20. The method of claim 17, wherein the display driver is integrated within a semiconductor chip,
wherein the bump array comprises a plurality of bump rows each comprising a set of bumps aligned in a first direction parallel to an edge of the semiconductor chip,
wherein the plurality of bump rows is aligned in a second direction perpendicular to the first direction, and
wherein processing the input pixel data to generate the compensated pixel data is based on which of the plurality of bump rows comprises the bump.

* * * * *